United States Patent
Kendall et al.

(10) Patent No.: US 6,779,045 B2
(45) Date of Patent: Aug. 17, 2004

(54) SYSTEM AND APPARATUS FOR INCREASING THE NUMBER OF OPERATIONS PER TRANSMISSION FOR A MEDIA MANAGEMENT SYSTEM

(75) Inventors: Terry L. Kendall, Diamond Springs, CA (US); Richard P. Garner, Cameron Park, CA (US); James W. Bridgewater, Folsom, CA (US); Deborah L. See, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 390 days.

(21) Appl. No.: 09/813,472

(22) Filed: Mar. 21, 2001

(65) Prior Publication Data

US 2002/0138676 A1 Sep. 26, 2002

(51) Int. Cl.⁷ .................................................. G06F 3/50
(52) U.S. Cl. ............................... 710/5; 710/8; 710/52; 713/2; 711/114
(58) Field of Search ..................... 710/5, 13, 19, 710/29, 31, 33, 52, 8; 712/225, 200; 709/100; 711/100, 114; 713/2

(56) References Cited

U.S. PATENT DOCUMENTS 5,509,134 A * 4/1996 Fandrich et al. ............. 711/103
5,682,497 A * 10/1997 Robinson .................... 395/430
5,765,184 A * 6/1998 Durante ....................... 711/103
5,801,985 A * 9/1998 Roohparvar ............ 365/185.01
5,956,742 A * 9/1999 Fandrich et al. ............. 711/103
6,370,651 B1 * 4/2002 Durante et al. .............. 713/322
6,493,504 B1 * 12/2002 Date et al. ..................... 386/95

OTHER PUBLICATIONS

Intel® Flash Data Integrator (FDI) User's Guide, Version 3.0, Aug. 2000, 228 pages.

Intel® Volt Advanced+Boot Block Flash Memory, 28F800C3, 28F160C3, 28F320C3, 28F640C3 (x16), Preliminary Datasheet, Oct. 2000, 68 pages.

* cited by examiner

Primary Examiner—Rehana Perneen
Assistant Examiner—Rijue Mai
(74) Attorney, Agent, or Firm—Blakely, Sokoloff, Taylor & Zafman LLP

(57) ABSTRACT

The present invention is in the field of flash memory. More particularly, embodiments of the present invention can enhance an interface of a flash memory device by increasing the number of operations performed per transmission from a media management system. Further, some embodiments of the invention are designed to interface the flash memory device and media management controller via an interconnection attachment and/or driver common to a second type of data storage device, such as a hard drive.

14 Claims, 5 Drawing Sheets

Figure 1:
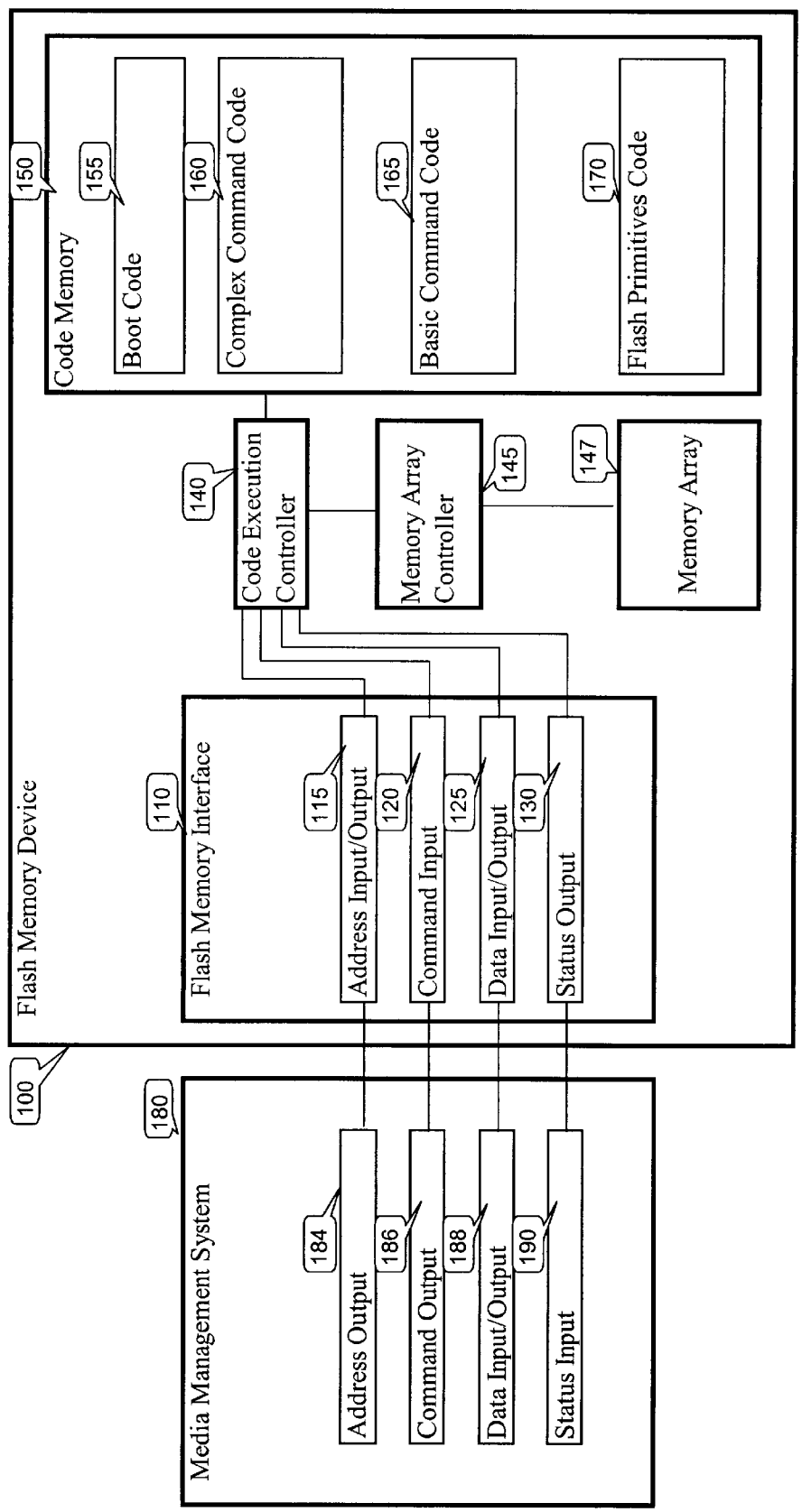

Receiving a complex command.

Executing the complex command by executing a flash memory complex command code.

Outputting a result of the complex command.

Receiving a complex command.

Executing the complex command by executing a flash memory complex command code.

Outputting a result of the complex command.

SYSTEM AND APPARATUS FOR INCREASING THE NUMBER OF OPERATIONS PER TRANSMISSION FOR A MEDIA MANAGEMENT SYSTEM

FIELD OF INVENTION

The present invention is in the field of flash memory. More particularly, the present invention provides a method, apparatus, and system to enhance an interface of a flash memory device.

BACKGROUND

Flash memory devices must be fast, low power, and physically compact data storage to remain competitive. The physical configuration and command structure of the memory affect the memory access speed. Memory access speed is based on the speed of manipulating data in flash memory that, on a fundamental level, requires programming, erasing, and reading the data. Algorithms typically referred to as flash primitives handle these fundamental procedures. Programming adds a charge to the memory cell, erasing removes a charge from the memory cell, and reading determines the charge stored in the memory cell. For a procedure to be performed on a memory cell, the memory cell's address must be latched. Latching is a method of selecting and holding the address of the memory cell to be programmed, erased, or read and requires application of certain voltages.

The flash memory devices typically incorporate basic command code and flash primitives code to latch and program, erase, or read a memory cell. Basic commands are routines that coordinate the use of flash primitives to manipulate data at a higher level. For example, the basic command for a read can receive an address, latch each transistor storing data for a byte beginning at that address, and initiate the flash primitives code for reading each transistor. The flash primitives reading algorithm may simply determine the contents of whatever memory cell is latched and indicate that the algorithm has completed the operation by returning a status. The basic command code can make the byte available at a data input/output and return a status indicating that the data from the address is available at that data input/output.

Commands performed on flash memory devices are commonly more complex than the basic commands. These complex commands typically involve more than one basic command or a repetition of a basic command. Complex commands focus on manipulating data rather than on how to make the flash memory device perform the data manipulation. For example, a software application such as a word processor may store a temporary copy of a file while that file is being edited. Periodically, the software application may also update the original file with changes to the temporary copy. It is not efficient for each software application to have a driver to manipulate each type of data storage device so the software application may instruct a media management system to store the data. The media management system can have a driver for each attached data storage device. Thus, the software application can instruct the media management system to make a copy of the file in a specific directory, causing the media management system to instruct the flash memory device to perform the reading, programming, and erasing to copy the data and then the reading, erasing, and programming that may be necessary to update the file.

Complex command benefits can be enhanced with some data structures such as a header data structure. The contents of a flash memory device can be organized in directories and files by creating headers. Headers can comprise references to subdirectories, parent directories, and/or address ranges that represent a single file. For example, files in a directory can be written to several address ranges depending upon where memory is available. The files can be located by reading the header. A complex command such as delete parameter, for instance, can be given a reference to a file within a directory and subdirectory. The delete parameter command can use the basic command read to find the directory, subdirectory, and file. Then, programming or erasing a bit representing validity or invalidity of the file can invalidate the data in the entire file. Invalidating the file effectively deletes the file but saves the cycles that would be required to erase the entire file. Regardless of the size of the file, the delete parameter procedure can complete the deletion in the time required to read the file header and program or erase a bit.

Unlike some complex commands, basic commands do not implement power loss and procedure interruption recovery measures. For example, when copying data, programming can be split up into units of memory cells, such as blocks or partial blocks. A memory register can store an indication such as how many of these units have been programmed and which unit is being programmed. If power is lost, a power loss recovery operation can read the memory register, discard the unit of data that was being programmed when power was interrupted, and resume programming at the discarded unit. The procedure interruption recovery operation may also read the memory register to determine where an operation was interrupted. Procedure interruption recovery may increase memory access speed by allowing interruption of long operations such as erasing to service short operations such as reading.

Several limitations are involved with issuing complex commands from a media management system. First, designing interfaces for each memory device detracts from development of other features and can limit the size of a product. Second, the time required to execute a complex command may be dependent upon the speed of the interface between the flash memory device and the media management system and the amount of data to be manipulated. For example, a find command may locate data in an address range. The media management system may transmit read commands for each byte in the address range. The basic command of reading within the flash memory device can then transmit the data at each address to the media management system and the media management system can compare the data to the data to be found. Once the search is complete, the media management system can return a result. Every address can require at least two transmissions, one to and one from the flash memory device. Third, the bus between the flash memory device and the media management system is busy during each read and write. Fourth, the media management system is busy during each transmission and comparison. Fifth, memory available to the media management system is allocated for complex command code. Finally, the bus from the memory containing complex command code to the media management system is busy while executing the code.

BRIEF FIGURE DESCRIPTIONS

Figure 2:
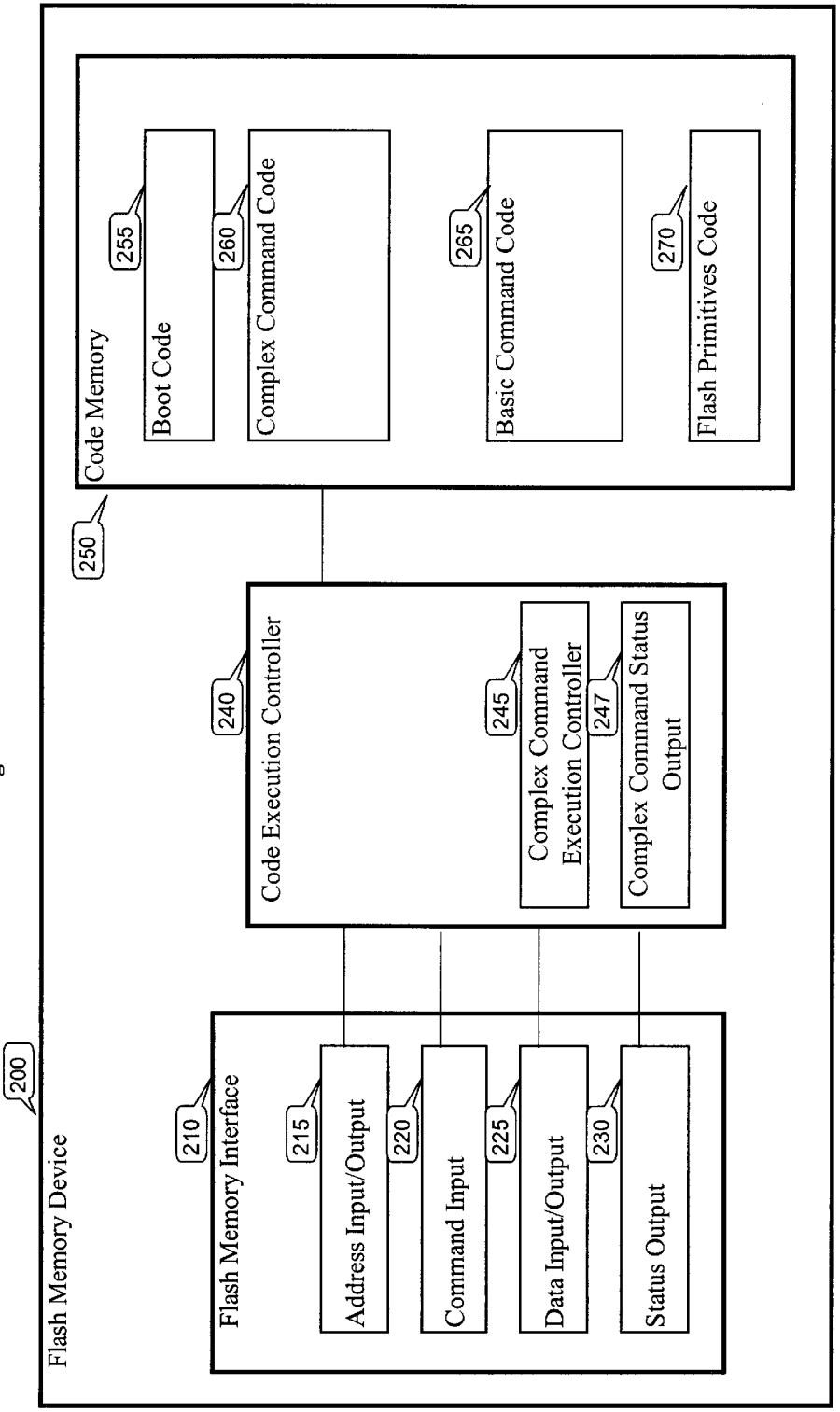

The accompanying drawings, in which like references indicate similar elements, show:

FIGS. 1–2 Example apparatus embodiments of the present invention.

FIGS. 3a–d Flow chart of embodiments of the present invention.

FIGS. 4a–d Alternative flow chart of embodiments of the present invention.

Figure 5:
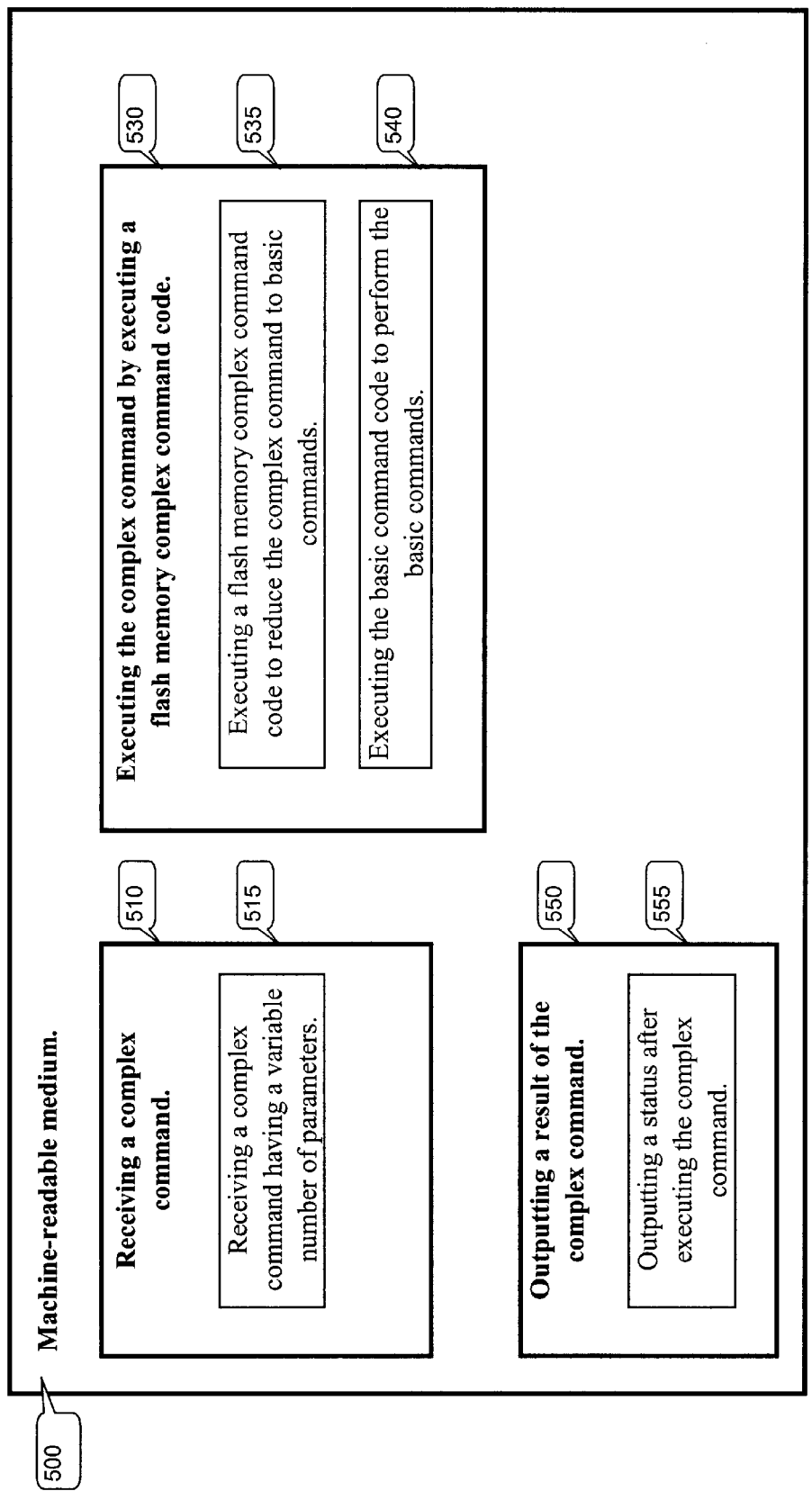

FIG. 5 Example machine-readable medium embodiments of the present invention.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments. The variations of embodiments anticipated for the present invention are too numerous to discuss individually so the detailed descriptions below are designed to make such embodiments obvious to a person of ordinary skill in the art.

In particular, the following describes method, apparatus, and system embodiments to enhance an interface of a flash memory device. Embodiments of the present invention can enhance an interface of a flash memory device by increasing the number of operations performed per transmission from a media management system. Further, some embodiments of the invention are designed to interface the flash memory device and media management controller via an interconnection attachment and/or driver common to a second type of data storage device, such as a hard drive. Basic commands may be operated on a single transistor, word line, or block, so incorporating a complex command to increase the number of operations performed per transmission between a media management system and a flash memory device can increase the efficiency of that interface.

Referring to FIG. 1, an embodiment for an apparatus to enhance an interface of a flash memory device 100, is shown. In this embodiment of the invention, the flash memory device 100 comprises a flash memory interface 110, a code execution controller 140, and a code memory 150. The flash memory interface 110 can be designed to plug into a media management system 180. The media management system 180 can be designed to interface with a hard drive and the flash memory device 100 can be designed to act like a hard drive via a default set of complex commands in the code memory 150. The code memory 150 contains microcode that may be executed only by the flash memory device's 100 internal controller, the code execution controller 140. The code memory 150 may also comprise data associated with the micro-code to facilitate implementation of the commands represented by the micro-code. The flash memory interface 110 comprises an address input/output 115, a command input 120, a data input/output 125, and a status output 130. The address input/output 115 can receive an address of a memory cell or header bits for a file or directory. The address input/output 115 is coupled to the code execution controller 140 and to an address output 184 of the media management system 180. The media management system 180 may transmit the address in conjunction with a complex command. The command input 120 is designed to receive a basic command or complex command from a command output 186 of a media management system 180 and is coupled to the code execution controller 140. The data input/output 125 may receive from or transmit to a data input/output 188 of a media management system 180, data related to a complex command or basic command. The status output 130 is coupled to the code execution controller 140 to receive the status of the execution of command code and coupled to a status input 190 to transmit the status of a command initiated by the media management system 180. In addition, the address input/output 115, command input 120, data input/output 125, and status output 130 can be multiple-function inputs so they can be temporarily reassigned to receive parameters for the complex command in some of these embodiments from the media management system 180 via its address output 184, command output 186, data input/output 188, and status input 190, respectfully. For example, when a complex command is received from the media management system 180, the flash memory complex command code 160 in code memory 150 may instruct the code execution controller 140 to accept transmissions of parameters via the inputs and/or outputs to decrease transmission time. The media management system 180 then retrieves the data resulting from the execution of the command and can transmit the data to the media management system 180 for a system such as a computer, personal digital assistant or cell phone.

The code execution controller 140 is designed to receive commands from the media management system 180 via the flash memory interface 110. The code execution controller 140 can execute the corresponding flash memory complex command code 160 in the code memory 150. When execution of the command code is complete, the code execution controller 140 can place the results on the data input/output 125 and modify the status output 130 to indicate that the results of the command are available. The media management system 180 can receive the status output 130 via the status input 190 and respond by retrieving data transmitted from the data input/output 125 via the data input/output 188. When the command executed is a complex command, the code execution controller 140 determines when the command is completed and alters the status output 130 accordingly.

Referring still to FIG. 1, the code memory 150 can comprise boot code 155, flash memory complex command code 160, basic command code 165, and flash primitives code 170. The boot code 155 is designed to initiate the operation of the flash memory device 100. The complex code 160 comprises code to instruct the code execution controller 140 to perform a complex command. The flash memory complex command code 160 may reside in protected memory or read only memory so it may not be corrupted accidentally. Protecting the complex code 160 rather than programming read only memory may allow the flash memory device 100 to be modified for specific applications. For example, the complex code 160 may comprise all the commands and data available to interface the flash memory device 100 by the media management system 180. In some of these embodiments, the complex command code and data are copied into the flash memory device 100 at the flash memory complex command code 160 when the media management system 180 and the flash memory device 100 are powered up. The new complex command code can either overwrite or be appended to the flash memory complex command code 160. The flash memory device 100 can then execute the new flash memory complex command code 160 when a complex command is received from the media management system 180. Several of these embodiments further comprise a random access memory queue to store commands received from the media management system 180. This queue can be approximately 30 kilobytes and can service the commands in order. The queue stores the commands in a fixed data structure, such as command, parameter one, parameter two, and parameter three and the flash memory complex command code 160, when executed, is designed to retrieve these commands from the data structure. Some embodiments can also include priority commands to be serviced prior to non-priority commands.

The basic command code 165 can comprise code to execute commands such as read, program, erase, lock block, and protection. These commands can be executed by the code execution controller 140 and can be designed to latch memory cells in a memory array 147 via a memory array controller 145. For example, the media management system 180 can transmit commands such as delete parameter and reclaim memory. The flash memory device 100 receives the commands and parameters for the commands via the flash memory interface 110. The code execution controller 140 executes the delete parameter command code in code memory 150 and stores the reclaim command in a priority based data structure memory queue in the memory array 147 via the memory array controller 145. The delete parameter command is designed to find data within a file and edit the file header to indicate the data is invalid. The code execution controller 140 then executes the reclaim command from the memory queue.

Alternate embodiments of the present invention comprise a random access memory queue separate from the memory array 147. Other embodiments allow a variable amount of the memory cells in the memory array 147 to be used as a random access memory queue.

Referring to FIG. 2, an embodiment for an apparatus to enhance an interface of a flash memory device 200 is shown. In this embodiment of the invention, the flash memory device 200 comprises a flash memory interface 210, a code execution controller 240, and a code memory 250. The flash memory interface 210 can be designed to plug into an interface for a flash memory device supporting only basic commands. The flash memory interface 210 can comprise an address input/output 215, a command input 220, a data input/output 225, and a status output 230. The address input/output 215 is designed to receive an address of a memory cell or a header for a file or directory and is coupled to the code execution controller 240. A media management system may transmit the address in conjunction with a complex command or the flash memory device 200 may output the address in response to a command from the media management system. The command input 220 can receive a basic command or complex command and is coupled to the code execution controller 240. The data input/output 225 is designed to receive or transmit data related to a command. The status output 230 may output the status of a command initiated by the media management system such as a complex command like reclaim memory. The reclaim memory command would, for example, search through a block for valid bits in headers and move the corresponding memory contents such that unused memory is consolidated in consecutive blocks and used memory is consolidated in consecutive blocks. Consolidating used memory into consecutive memory locations can reduce the number of required headers, increasing the efficiency of data manipulation. Further, the address input/output 215, command input 220, data input/output 225, and status output 230 may be multiple-function inputs designed for temporary reassignment to receive parameters for the complex command in some of these embodiments. For example, when a complex command is received from the media management system, the flash memory complex command code 260 in code memory 250 may instruct the code controller 240 to accept transmissions of parameters via the inputs and/or outputs to decrease transmission time.

Referring again to FIG. 2, the code execution controller 240 is designed to receive commands from the media management system via the flash memory interface 210 and execute the corresponding flash memory complex command code 260 or basic command code 265 in the code memory 250. After the command code is executed, the code execution controller 240 can place the results on outputs and change the status output 230 via the complex command status output 247. The code execution controller 240 comprises the complex command status output 247 to hold the status output 230 to indicate a task is incomplete unless a complete result to a command is available on the outputs of the flash memory interface 210. For example, if a complex command such as copy is transmitted from the media management system, the complex command status output 247 will modify the status to indicate completion after the copy command executes but when the media management system transmits a command such as move which may call the complex command copy and the complex command delete parameter, the complex command status output 247 will modify the status to indicate completion after both commands execute. The code execution controller 240 also comprises a complex command execution controller 245 to execute flash memory complex command code 260.

The code memory 250 comprises boot code 255, flash memory complex command code 260, basic command code 265, and flash primitives code 270. The boot code 255 is designed to initiate the operation of the flash memory device 200. The complex code 260 comprises code to instruct the code execution controller 240 to perform a complex command. The flash memory complex command code 260 resides in protected memory so it may not be corrupted accidentally but can be updated or replaced one or more times. Protecting the complex code 260 from accidental corruption can be accomplished by requiring a specific sequence of commands to latch the memory cells. Further, protecting the complex code 260 may also allow the flash memory device 200 to be tailored for a specific use. For example, the complex code 260 may comprise the algorithms and data to process complex commands such as copy; move; find; write parameter including append, replace, reserve, and modify; delete parameter; read parameter; and reclaim memory. The move command of the complex code 260, may, for instance, perform the copy command, then invalidate the header of the original location to facilitate the reclaim command. The reclaim command may be a request for a large unused unit of memory such as a block of memory and may move the contents of used memory cells out of a block to create that unused unit of memory. The find command, on the other hand, may receive dynamic parameters including a start address and data to find and configuration parameters including increment or skip over, a mask filter to filter out irrelevant data, a stop value to terminate the search when encountered, a stop mask to ignore certain occurrences of stop values, an end length to stop an unsuccessful search, and an instance count to find the nth instance of the data encountered. The find command may also include code to return one or more addresses when the data is found.

The basic command code 265 comprises code and data to execute commands such as read, program, erase, lock block, and protection. These commands can be executed by the code execution controller 240 and can be designed to latch memory cells for commands represented by the flash primitives code 270. For example, the media management system may transmit a basic command read to the flash memory interface 210. The flash memory interface 210 may receive the command in the form of data representing an address of a memory cell at the address input/output 215 and a representation of the read command at the command input 220. The code execution controller 240 can retrieve the command and address representations from the flash memory interface 210 and execute the basic command code 265 for a read command. The code execution controller 240 can latch the memory cell at the address and initiate the read algorithm in the flash primitives code 270. The flash primitives code 270, when executed by the code execution controller 240, determines the data stored in the latched memory cell and applies the data to the data input/output 225. Once the data is applied to the data input/output 225, the status output 230 is modified to indicate that the read command is completed.

Alternate embodiments of the present invention comprise a complex code 260 in read only memory to protect the code from corruption. Some of these embodiments comprise a header reserving a fixed amount of memory that can contain additional commands. Other embodiments comprise a header in protected memory that can allow a variable amount of memory to be used to store additional complex commands.

Referring to FIGS. 3a–d, a flow chart of an embodiment is shown. The flow chart comprises receiving a complex command 300, executing the complex command by executing a flash memory complex command code 330, and outputting a result of the complex command 350. Receiving a complex command 300 comprises receiving a complex command in a format common to a second type of storage device 305. For example, the product incorporating a flash memory device may also have a hard drive and the flash memory device may be used to store data just like the hard drive. Thus, receiving a complex command 300 may receive complex commands designed such that the flash memory device can act like a hard drive from the perspective of the media management system by either adapting a standard interface or designing a new interface. These commands may be designed to mimic other storage devices also such as tape drives by designing the complex commands to match the command set of the tape drive. In this way the media management system software or firmware is minimized. These commands may also have dynamic parameters and configuration parameters to perform a function common to another type of storage device. A move command, for instance, may copy a unit of memory, masking out certain parts of the unit, erase a valid bit in an old header and program a bit in a new header. To facilitate these functions, the move command may have dynamic parameters including a source address, destination address, and byte or word count and configuration parameters including a skip-over mask, skip offset, and skip length to describe data not to be copied. Further, some embodiments also have the same interconnection attachment as another storage device, such as a tape drive or hard drive, to connect the flash memory device to the media management system.

Figure 3A:
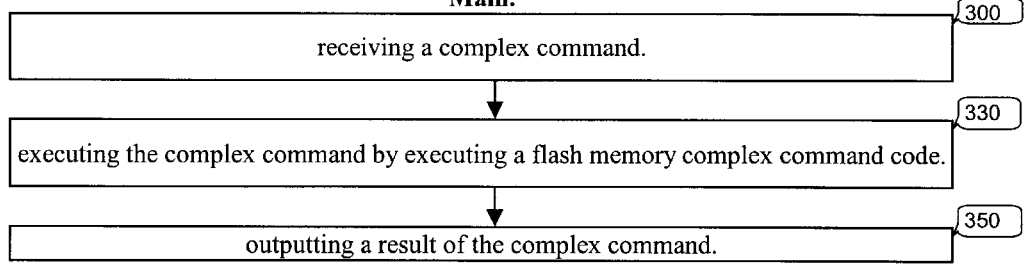
Figure 3B:
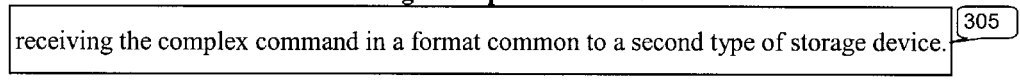
Figure 3C:
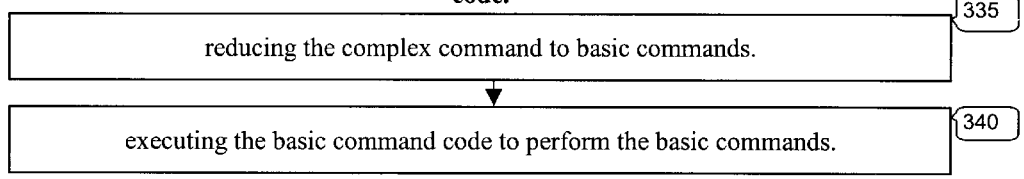

Referring now to FIGS. 3a and 3c, a detailed flow chart for executing the complex command by executing a flash memory complex command code 330 is shown. Executing the complex command by executing a flash memory complex command code 330, for this example embodiment, comprises executing code designed to account for a slew rate of a transistor in a flash memory device and to reduce the delays for the flash memory device and the media management system resulting from transmissions of commands, data, and addresses between the media management system and the flash memory device. The flash memory complex command code can be micro-code, executable by the code execution controller of a flash memory device. Since the flash memory complex command code is executed completely within the flash memory device, the code can be executed much more quickly than when complex command code is executed in the media management system. When complex commands are executed within the flash memory device, the slew rates may be accounted for by the flash memory complex command code and/or the basic command code. The number of transmissions to and from the media management system can also be reduced. Further, having flash memory complex command code may make it desirable to break basic commands into respective subroutines. For example, a basic command to erase a memory cell may require a first voltage to be supplied by a negative charge pump and a second voltage from that negative charge pump to verify that the memory cell has been erased. When memory cells in more than one block coupled to the negative charge pump need to be erased, the basic command code may perform the erase and verify in one block and then perform the erase and verify in the other block. However, if the basic command to erase is separated into an algorithm to erase and an algorithm to verify, changing the negative charge pump output may occur only once, reducing the time required to perform the erasures.

Referring again to FIGS. 3a and 3c, executing the complex command by executing a flash memory complex command code 330 may comprise reducing the complex command to basic commands 335 and executing the basic command code to perform the basic commands 340. Upon receipt of the complex command, as well as any parameters necessary to implement the complex command, the flash memory complex command code can be fully executed within the flash memory device. Reducing the complex command to basic commands 335 can be designed to produce a series of basic commands with parameters to accomplish the complex command. For instance, the complex command may be a copy command. The copy command may be accompanied by several parameters comprising an original file to copy and a file reference for the copied file. Reducing the complex command to basic commands 335 may produce basic commands of read to find the header for the file to be copied, read to obtain data from the file, program to create a copy of the file, and program to change the headers of the copied file and original file. Erasing may also be necessary to reclaim dirty space, such as space containing invalidated data. Executing the basic command code to perform the basic commands 340 can perform the basic commands determined by the flash memory complex command code. In some embodiments, the basic commands for a first complex command are placed in buffers so executing the basic command code to perform the basic commands 340 may comprise retrieving the basic commands from a buffer. In these embodiments, the flash memory complex command code for a second complex command can begin to produce basic commands while awaiting a result from each basic command of the first complex command.

Figure 3D:
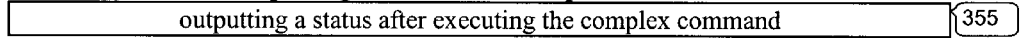

Referring now to FIGS. 3a and 3d, a detailed flow chart for outputting a result of the complex command 350 is shown. Outputting a result of the complex command 350 can comprise outputting a status after executing the complex command 355. After a flash memory complex command is complete, the flash memory device may place any result from the execution of the code on an output and can indicate the complex command results are available by driving an output status high. For example, the result of a find command may be an address and may be applied to the address input/output of the flash memory device. On the other hand, the command may require a read and the output may be one or more bits of data. Depending upon the number of bits in the data, the data can either be transmitted in parallel or serially via the data input/output of the flash memory device.

In some embodiments, the flash memory complex command code is stored in read only memory to protect the code from being corrupted. For example, some manufacturers of products that use flash memory devices such as digital cameras may provide no option to upgrade the operating system built into the camera. There is no reason to upgrade the complex commands built into that flash memory device. In some of these embodiments, read only memory such as write once memory is used so the manufacturer of the product using the flash memory device can store flash memory complex command code prior to shipping.

Although one or more complex commands may be written into read only memory, several embodiments allow additional complex commands to be stored in protected memory in the flash memory device. By allowing additional or custom complex commands to be stored in the flash device, the media management system can customize the use of the flash memory device. For example, if the flash memory device is used in a laptop and a software application such as a specific purpose database stores data in a fixed structure, the fixed structure can be defined by a header address and specific offsets. To increase the efficiency of the data storage and retrieval, the application designers can also design one or more complex commands for storing and retrieving the data from that data structure. The complex commands may perform multiple basic commands so the number of commands and data transmissions to and from the flash memory device is minimized. The flash memory device can complete execution of the complex commands more quickly when the transmissions between the media management system and the flash memory device are minimized. In addition, the database application can perform additional operations while the flash memory device performs a complex command so the speed of the software application can be increased.

In alternative embodiments, the complex command is stored in protected memory. When stored in protected memory, the complex command can be updated periodically. These embodiments are designed for products such as computers where the operating system may be updated periodically. When their operating system is updated, the format for storing data may also be updated. So in these embodiments, the protection can be removed and the complex commands may be amended or replaced to match the requirements of the new operating system.

Referring now to FIGS. 4a–d, an alternative embodiment to enhance a flash memory device interface is shown. The embodiment is designed to be easily adaptable to any media management system. This embodiment comprises receiving a complex command 400, executing the complex command by executing a flash memory complex command code 430, outputting a result of the complex command 450, and replacing the code for the complex command with a code for a second complex command 460. Receiving a complex command 400 can comprise receiving a complex command from a set of complex commands in flash memory complex command code. The flash memory complex command code may be downloaded from the operating system of a computer upon powering the computer. The new set of complex commands can be incorporate and/or be appended to the existing complex commands in the flash memory code. Receiving a complex command 400, in the present embodiment, further comprises receiving a complex command having a variable number of parameters 405. When a complex command has a variable number of parameters, the flash memory complex command code may be designed to interpret complex commands stored with parameters in a first-in, first-out memory queue on the flash memory device. For example, the media management device may transmit a complex command with parameters to the flash memory device and the flash memory device may store the transmissions directly into the top of the buffer. A pointer may indicate the top of the buffer as well as the next complex command to be executed. When the flash memory device is ready to perform the complex command, the first part of the complex command memory, e.g. the first word, may be read to determine the flash memory complex command code to be executed. Once executed, the flash memory complex command code can determine the offset of the parameters in the buffer from the first part.

Referring again to FIGS. 4a and 4c, a detailed flow chart for executing the complex command by executing a flash memory complex command code 430 is shown. Executing the complex command by executing a flash memory complex command code 430 can comprise reducing the complex command to basic commands with a procedure interruption recovery operation 435, reducing the complex command to basic commands with a power loss recovery operation 440, and executing the basic command code to perform the basic command 445. Reducing the complex command to basic commands with a procedure interruption recovery operation 435 and reducing the complex command to basic command with a power loss recovery operation 440 can break a complex command into one or more basic commands having a procedure to facilitate tracking the progress of the complex command's execution. In the present embodiment, the tracking procedures for both power loss and procedure interruption recovery are combined. For instance, during a move command, the data in an address range are copied to a new location and a header bit for the data at the original address range is modified to indicate the data within the original address range are invalid. The copy procedure may be performed one file at a time and each file has a header with a bit indicating validity or invalidity. Every file is copied prior to changing its header bit, in this example, because changing header bit requires programming which may cause time delays by requiring voltages within a block to be transitioned. When a first file is part of a block comprising a second file, transitioning the voltages to program a header bit and transitioning the voltages back to read the next file can cause unnecessary delay. However, header bits in the new location may be programmed to indicate when a file is completely copied. If a power loss or procedure interruption occurs after file two is copied but while copying file three, a power loss or procedure interruption recovery operation can read the first header in the original location to determine that the power loss or procedure interruption occurred while copying since that header bit still indicates the file is valid. The power loss or procedure interruption recovery procedure can then read the copied file one, file two, and file three header bits to determine that copied file one and copied file two headers indicate valid files but the copied file three header indicates an invalid file. Thus, the power loss or procedure interruption recovery can resume the move command at copying file three.

Executing the complex command by executing a flash memory complex command code 430, for this example embodiment, comprises executing a flash memory complex command code directly from protected memory. The flash memory complex command code is stored in a protected memory location to create a more flexible interface for the flash memory device. The interface is more flexible because it can allow replacing the flash memory complex command code with a second flash memory complex command code 460. Flash memory devices can be designed to last ten years or more under normal operating conditions so the device may support the operating systems of subsequent products. For example, a diverse group of personal digital assistants have been manufactured over the last ten years, changing from one reduced instruction set computer (RISC) chip to another. The scope of the instruction set of the RISC chip can have a direct impact on the design of the media management system to handle storage devices and a direct impact on the most efficient complex commands to handle a storage medium such as the flash memory device. Thus, storing the complex commands in protected memory can allow the complex commands to be updated or replaced periodically by replacing the flash memory complex command code with a second flash memory complex command code 460.

Figure 4A:
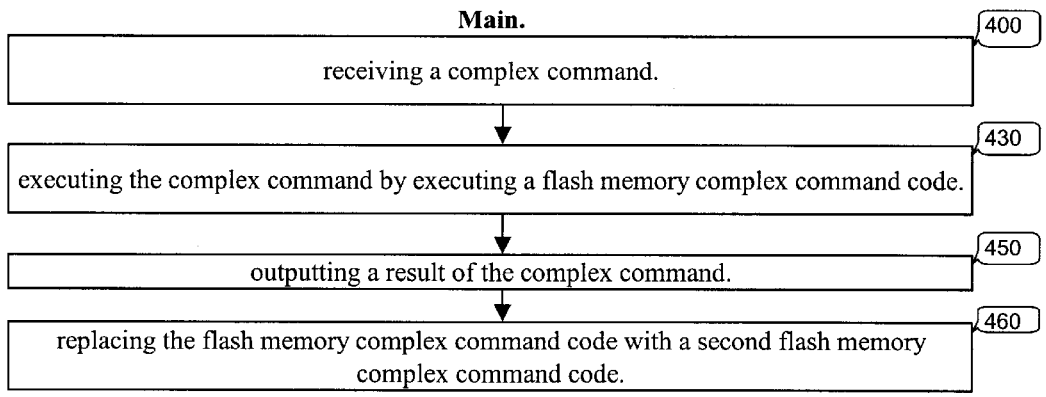
Figure 4B:
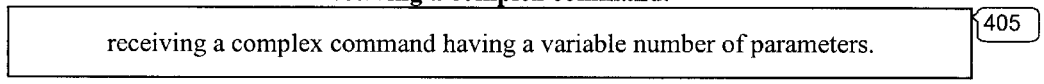
Figure 4C:
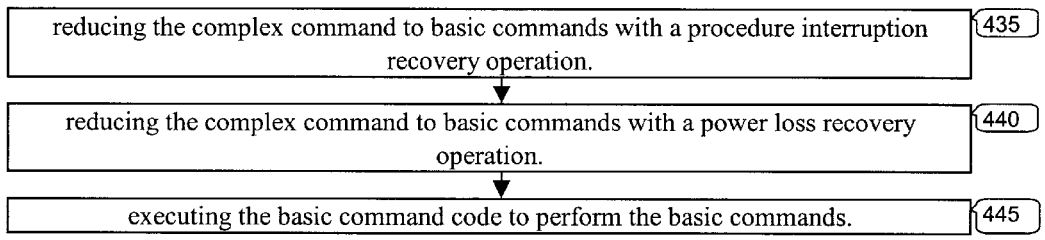
Figure 4D:
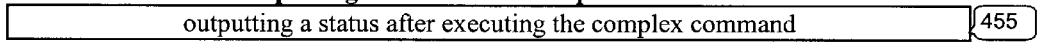

Referring now to FIGS. 4a and 4d, outputting a result of the complex command 450 can be adapted to confirm to the media management system that the complex command has been executed. The media management system may perform other tasks while a complex command is executing so a reference to the complex command transmission as well as a result of the complex command may be applied to the outputs of the flash memory device prior to outputting a status after executing the complex command 445. Once the status is output, the result and the reference to the complex command transmission can be retrieved by the media management system.

In alternative embodiments, a new physical interface can be designed for the flash memory device. These embodiments can transmit and receive complex commands more quickly because they have parallel inputs for multiple parameters. For example, the complex commands can be designed such that the flash memory device can initiate a complex command on the first transmission from the media management system. Thus, the flash memory device can complete the complex command without the delay introduced by multiple transmissions. The physical interface can be designed to allow more than one complex command to initiate on a first transmission or to optimize the utilization of space for the interface against the reduction in delay time introduced by transmission of commands and data to and from the media management system.

In some embodiments, the new physical interface is designed to remain compatible with standard interfaces but offer added benefits when the new physical interface is utilized. For example, a new set of pins can be added to the flash memory device in an area reserved for future pins. The added pins can be used as additional inputs in parallel with the standard command interface. Then, when a complex command is transmitted to the flash memory device using the new pins, the flash memory device can sense, or alternatively, be set up to use the additional pins. The additional pins can transmit one or more parameters for the complex command such that transmission time is reduced. The reduced transmission time is also realized when returning the results of the complex command. With a faster transmission of the command, the flash memory device may initiate the complex command with less delay resulting from the transmission. The media management system also realizes the reduced transmission time since it is able to initiate other tasks more quickly.

Referring now to FIG. 5, a machine-readable medium embodiment of the present invention is shown. A machine-readable medium includes any mechanism that provides (i.e. stores and or transmits) information in a form readable by a machine (e.g., a computer), that when executed by the machine, can perform the functions described herein. For example, a machine-readable medium may include read only memory (ROM); random access memory (RAM); magnetic disk storage media; optical storage media; flash memory devices; electrical, optical, acoustical or other form of propagated signals (e.g. carrier waves, infrared signals, digital signals, etc.); etc. . . . Several embodiments of the present invention can comprise more than one machine-readable medium depending on the design of the machine.

This machine-readable medium embodiment comprises a machine-readable medium 500 comprising code, which when executed performs the process of receiving a complex command 510, executing the complex command by executing a flash memory complex command code 530, and outputting a result of the complex command 550. Receiving a complex command 510 may be designed to monitor the command input for a change indicating the transmission of a command from the media management system. Receiving a complex command 510 can comprise receiving a complex command having a variable number of parameters 515. This embodiment comprises a buffer to store a complex command until the command can be performed. The complex command, for instance, is transmitted by the media management system and a code execution controller recognizes the complex command. The code execution controller can determine from the flash memory complex command code how many parameters are associated with the complex command and store the parameters in a buffer, such as a first-in, first-out random access memory queue, until the complex command can be processed. While executing the complex command by executing a flash memory complex command code 530, the flash memory device may be receiving a subsequent complex command with parameters and store the subsequent command in the buffer. Executing the complex command by executing a flash memory complex command code 530 can comprise executing a flash memory complex command code to reduce the complex command to basic commands 535 and executing the basic command code to perform the basic commands 540. In several embodiments, executing a flash memory complex command code to reduce the complex command to basic commands 535 comprises reading the complex command with parameters from the buffer, locating the corresponding complex command code and initiating the complex command code. In many of these embodiments, executing the basic command code to perform the basic commands 540 may comprise executing a series of basic commands in accordance with the flash memory complex command code, modifying the buffer to indicate the complex command has been executed, and moving the pointer of the buffer to a subsequent complex command. In this way, the media management system is free to perform other tasks without being involved in flash memory device specific data storage procedures. For example, when a media management system is copying data from a second data storage device, the present embodiment may perform the writes to flash memory while the media management system performs reads of the second data storage device. In several of these embodiments, the writes to the flash memory continue while a complex command and data from a read of the second data storage device are being stored in the random access memory buffer.

The present embodiment further comprises outputting a result of the complex command 550. The type of result output is dependent upon the type of complex command. For instance, when finding data at a location in flash memory, outputting a result of the complex command 550 may comprise outputting an address comprising the 30th occurrence of data at the location and outputting a status after executing the complex command 555. On the other hand, when reading data at a location, outputting a result of the complex command 550 may comprise outputting data corresponding to the data read from the location and outputting a status after executing the complex command 555. In some cases, outputting data further comprises decompressing the data read from the memory location. Outputting a status after executing the complex command 555, may comprise driving a status output low to indicate that the flash memory complex command code has completed performing the complex command as specified by the associated parameters.

In some alternative embodiments, the embodiment may continue receiving parameters until one or more bits transmitted indicate that the last parameter has been received. In some of these embodiments, the media management system may drive a command output low indicating that a command is being transmitted and drive a command output high when the last parameter has been transmitted. Several such embodiments comprise using inputs for multiple functions. Using inputs for multiple functions can comprise receiving a complex command parameter via the command input, in addition to receiving a complex command parameter via the address input/output and data input/output of a flash memory device. These embodiments may also copy each complex command with a variable number of parameters into the buffer, complex command first, and allow the flash memory complex command code to determine the end of the parameters for a first complex command and the subsequent complex command.

What is claimed is:

1. A system, comprising:
   a media management system; and
   a flash memory device coupled to said media management system, comprising:
      a flash memory interface;
      a code execution controller coupled to the flash memory interface;
      a memory array controller coupled to code execution controller;
      a memory array coupled to the memory array controller; and
      a code memory coupled to the code execution controller, the code memory comprising a flash memory complex command code, a boot code, a basic command code, and a flash primitive code.

2. The system of claim 1, wherein said media management system comprises:
   an address output coupled to said flash memory device;
   a command output coupled to said flash memory device;
   a data input/output coupled to said flash memory device; and
   a status input coupled to said flash memory device.

3. The system of claim 1, wherein said media management system comprises a driver to transmit the complex command in the same format to a second type of data storage device.

4. The system of claim 1, wherein the flash memory interface comprises an interconnection attachment for said media management system common to a second type of data storage device.

5. The system of claim 1, wherein said flash memory interface comprises a multiple-function input.

6. The system of claim 1, wherein the code execution controller comprises:
   a complex command execution controller coupled to the complex code and coupled to the flash memory interface; and
   a complex command status output coupled to the flash memory interface.

7. An apparatus, comprising:
   a code memory comprising a flash memory complex command code, a flash memory complex command code, a boot code, a basic command code, and a flash primitive code;
   a code execution controller coupled to said code memory; and
   a flash memory interface coupled to said code execution controller.

8. The apparatus of claim 7, further comprising:
   a memory array controller coupled to said code execution controller; and a memory array coupled to the memory array controller.

9. The apparatus of claim 7, wherein said code memory further comprises:
   a boot code coupled to said code execution controller;
   a basic command code coupled to said code execution controller;
   a flash primitive code coupled to the basic command code.

10. The apparatus of claim 7, wherein said code memory comprises protected memory cells.

11. The apparatus of claim 7, wherein said code execution controller comprises:
    a complex command execution controller coupled to the complex code and coupled to the flash memory interface to receive and execute a complex command in a format common to a second type of data storage device; and
    a complex command status output coupled to the flash memory interface.

12. The apparatus of claim 7, wherein said flash memory interface comprises:
    an address input/output coupled to said code execution controller;
    a command input coupled to said code execution controller;
    a data input/output coupled to said code execution controller; and
    a status output coupled to said code execution controller.

13. The apparatus of claim 7, wherein said flash memory interface comprises an interconnection attachment for said media management system common to a second type of data storage device.

14. The apparatus of claim 7, wherein said flash memory interface comprises a multiple-function input.

* * * * *